United States Patent
Chiu et al.

(10) Patent No.: US 12,087,665 B2
(45) Date of Patent: Sep. 10, 2024

(54) THROUGH SUBSTRATE VIA STRUCTURE AND MANUFACTURING METHOD THEREOF, REDISTRIBUTION LAYER STRUCTURE AND MANUFACTURING METHOD THEREOF

(71) Applicant: Industrial Technology Research Institute, Hsinchu (TW)

(72) Inventors: Wei-Lan Chiu, Kaohsiung (TW); Hsiang-Hung Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 371 days.

(21) Appl. No.: 17/321,536

(22) Filed: May 17, 2021

(65) Prior Publication Data

US 2022/0301980 A1 Sep. 22, 2022

(30) Foreign Application Priority Data

Mar. 16, 2021 (TW) .................................. 110109308

(51) Int. Cl.
  *H01L 23/48* (2006.01)
  *H01L 21/768* (2006.01)
(52) U.S. Cl.
  CPC ...... *H01L 23/481* (2013.01); *H01L 21/76898* (2013.01)
(58) Field of Classification Search
  CPC .................. H01L 23/481; H01L 21/76898
  See application file for complete search history.

(56) References Cited

U.S. PATENT DOCUMENTS

| 6,242,349 | B1 | 6/2001 | Nogami et al. |
| 7,368,379 | B2 | 5/2008 | Tsao et al. |
| 8,836,121 | B2 | 9/2014 | Chen et al. |
| 8,957,323 | B2 | 2/2015 | Chen et al. |
| 9,476,140 | B2 | 10/2016 | Chen et al. |
| 10,094,033 | B2 | 10/2018 | Chen et al. |

(Continued)

FOREIGN PATENT DOCUMENTS

| CN | 105633038 | 6/2016 |
| TW | 201321557 | 6/2013 |

(Continued)

OTHER PUBLICATIONS

"Notice of Allowance of Taiwan Counterpart Application," issued on Nov. 25, 2021, pp. 1-3.

(Continued)

*Primary Examiner* — Victor A Mandala
*Assistant Examiner* — Colleen E Snow
(74) *Attorney, Agent, or Firm* — JCIPRNET

(57) ABSTRACT

A through substrate via structure and a manufacturing method thereof, and a redistribution layer structure and a manufacturing method thereof are provided. The through substrate via structure includes a columnar conductive layer and a nanotwinned metal film disposed at least around the conductive layer. In a cross-section of the through substrate via structure, relative to a total area of the conductive layer and the nanotwinned metal film, an area ratio of the nanotwinned metal film is 50% or less by area.

10 Claims, 6 Drawing Sheets

(56) References Cited

U.S. PATENT DOCUMENTS

| | | | |
|---|---|---|---|
| 2012/0276403 A1* | 11/2012 | Nakagawa | H01L 23/3735 |
| | | | 205/50 |
| 2015/0064496 A1 | 3/2015 | Chen et al. | |
| 2016/0190007 A1 | 6/2016 | Wang et al. | |
| 2016/0355940 A1 | 12/2016 | Chen et al. | |
| 2020/0236782 A1 | 7/2020 | Ho et al. | |
| 2021/0020599 A1 | 1/2021 | Chen et al. | |
| 2022/0064812 A1* | 3/2022 | Whitten | C25D 5/605 |

FOREIGN PATENT DOCUMENTS

| | | |
|---|---|---|
| TW | I455663 | 10/2014 |
| TW | 201904001 | 1/2019 |
| TW | 202028105 | 8/2020 |
| TW | 202035797 | 10/2020 |
| TW | 202038409 | 10/2020 |

OTHER PUBLICATIONS

Sanghyun Jin et al., "Electrodeposition of Nanotwin Cu by Pulse Current for Through-Si-Via (TSV) Process", J. Nanosci. Nanotechnol., vol. 16, Issue 5, May 2016, pp. 5410-5414.

Fu-Long Sun et al., "Bottom-Up Electrodeposition of Large-Scale Nanotwinned Copper within 3D Through Silicon Via", Materials, vol. 11, Issue 2, Feb. 2018, pp. 1-7.

Myong-Hoon Roh et al., "Extrusion Suppression of TSV Filling Metal by Cu—W Electroplating for Three-Dimensional Microelectronic Packaging", Metallurgical and Materials Transactions A, vol. 46A, May 2015, pp. 2051-2062.

\* cited by examiner

THROUGH SUBSTRATE VIA STRUCTURE AND MANUFACTURING METHOD THEREOF, REDISTRIBUTION LAYER STRUCTURE AND MANUFACTURING METHOD THEREOF

CROSS-REFERENCE TO RELATED APPLICATION

This application claims the priority benefit of Taiwan application serial no. 110109308, filed on Mar. 16, 2021. The entirety of the above-mentioned patent application is hereby incorporated by reference herein and made a part of this specification.

TECHNICAL FIELD

The disclosure relates to relates to a through substrate via structure and a manufacturing method thereof.

BACKGROUND

With the development of semiconductor technology, some semiconductor wafers/dies are gradually reduced in size. In the meanwhile, more functions need to be integrated into the semiconductor dies. As a result, other semiconductor dies and packages have become much larger.

A through substrate via (TSV) and a redistribution layer (RDL) are formed in a package substrate to distribute power and signals in the package. Therefore, it is necessary that the through substrate via and the redistribution layer maintain properties of low resistance and low insertion loss. Nanotwinned Cu is a currently developed nano-level twinned structure material, which has characteristics of high electromigration resistance, anti-thermal fatigue, high mechanical strength (such as tensile strength and hardness), good conductivity, high corrosion resistance behavior, good heat dissipation, and good thermal stability, etc.

However, manufacturing nanotwinned Cu by electroplating generally requires a pulse electroplating method, and such manufacturing technique has high cost, and electroplating efficiency thereof is relatively poor. Moreover, the pulse electroplating method may only produce a fine and irregular nanotwinned structure. In the conventional technology, a direct current (DC) electroplating method requires rotation of a cathode to be plated or an electroplating solution and restriction in a special seed layer of the substrate, and only a neatly arranged nanotwinned structure with a (111) plane may be plated. Based on the above restriction, the nanotwinned Cu is hard to be comprehensively implemented in the current industry.

SUMMARY

The disclosure provides a through substrate via structure, including a columnar conductive layer and a nanotwinned metal film disposed at least around the conductive layer. In a cross-section of the through substrate via structure, relative to a total area of the conductive layer and the nanotwinned metal film, an area ratio of the nanotwinned metal film is 50% or less by area.

The disclosure also provides a redistribution layer structure, including the through substrate via structure, a conductive layer disposed on at least one surface of the through substrate via structure, and a nanotwinned metal film disposed on the conductive layer.

The disclosure provides a manufacturing method of a through substrate via structure, including the following steps. An insulating layer is disposed on the substrate. The insulating layer is etched. A nanotwinned metal film is disposed at least at an etched portion of the insulating layer. After the nanotwinned metal film is disposed, a conductive layer is disposed at least at the etched portion of the insulating layer. In a cross-section of the through substrate via structure, relative to a total area of the conductive layer and the nanotwinned metal film, an area ratio of the nanotwinned metal film is 50% or less by area.

The disclosure further provides a manufacturing method of a redistribution layer structure, including the manufacturing method of the through substrate via structure described above, a step of disposing a patterned conductive layer on at least one surface of the through substrate via structure, and a step of disposing a nanotwinned metal film on the conductive layer.

Several exemplary embodiments accompanied with figures are described in detail below to further describe the disclosure in details.

DETAILED DESCRIPTION OF DISCLOSED EMBODIMENTS

Hereinafter, embodiments of the disclosure are described in detail. The details provided in the embodiments are exemplary, and are not intended to limit the scope of the disclosure. Those having ordinary skill in the art may modify or change the details according to the requirements of actual implementation.

Figure 1:
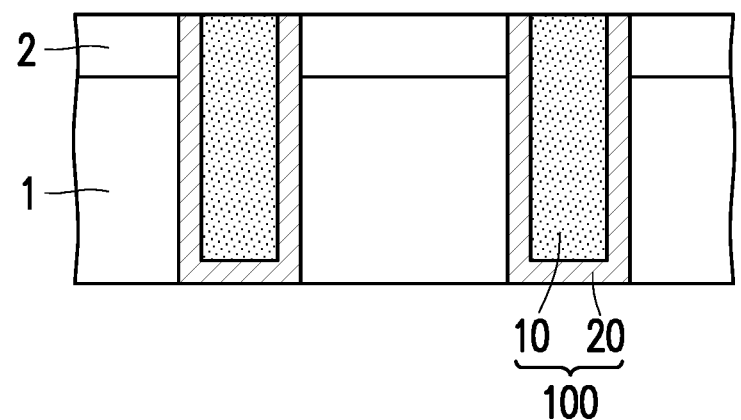
FIG. 1 is a schematic view illustrating a through substrate via structure according to an embodiment of the disclosure.

FIG. 1 is a schematic view illustrating a through substrate via structure according to a first embodiment of the disclosure. The disclosure provides a through substrate via structure, which may improve characteristics of anti-electromigration, elastic modulus and mechanical strength. In the meanwhile, a manufacturing time of the through substrate via structure may also be shortened. In the first embodiment of the disclosure, a through substrate via structure 100 includes a columnar conductive layer 10 and a nanotwinned metal film 20 disposed at least around the conductive layer 10.

As shown in FIG. 1, the conductive layer 10 in the through substrate via structure 100 is columnar, and the nanotwinned metal film 20 is disposed at least around the conductive layer 10, so as to form a through substrate via in a substrate 1 provided with an insulating layer 2.

An aperture of the through substrate via is about 1 μm to 100 μm, and is good about 5 μm to 20 μm.

When multiple through substrate vias are formed in the substrate 1, a pitch between the respective through substrate vias is about 1 μm to 1000 μm, and is good about 5 μm to 50 μm.

Metal in the nanotwinned metal film 20 is at least one selected from a group consisting of Cu, Ag, Ni, Co, W, and Au, and Cu is good to choose.

A material of the conductive layer 10 is not particularly limited, as long as the material may achieve the function of the conductive layer, which, for example, may be Cu, W, Au, Ag, Ni, Co, polyimide (PI), polybenzoxazole (PBO), benzocyclobutene (BCB), or silicon dioxide. The material of the conductive layer 10 is the same metal as the nanotwinned metal film 20, such as Cu.

In a cross-section of the through substrate via structure 100, relative to a total area of the conductive layer 10 and the nanotwinned metal film 20, an area ratio of the nanotwinned metal film 20 is 50% or less by area, and is good about 20% to 50% by area. If the area ratio of the nanotwinned metal film 20 exceeds 50% by area, an electroplating time of the nanotwinned metal film may rise sharply. Moreover, if the area ratio of the nanotwinned metal film 20 exceeds 50% by area, it is possible that a hollow void structure is generated due to the difference in an electroplating rate between a bottom and a top of the through substrate via, which is not good.

Here, the so-called "cross-section" refers to a plane parallel to an extending direction of the substrate 1 and substantially perpendicular to the through substrate via structure 100.

In addition, regarding a depth/an aperture ratio of the through substrate via structure 100, it is usually 0.1 to 100, and is good about 10 to 100, and better about 10 to 20. If the ratio is in the above range, a manufacturing time of the through substrate via structure 100 may be shortened, which is good.

Figure 2:
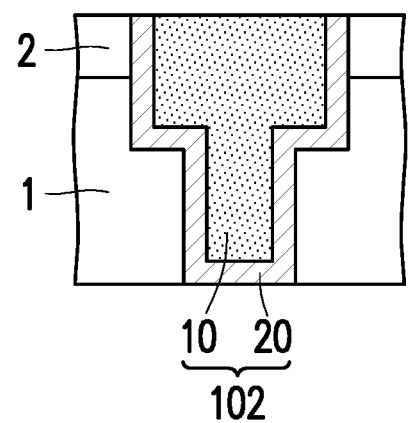
FIG. 2 is a schematic view illustrating a through substrate via structure according to a modification of the disclosure.

In addition, in the first embodiment shown in FIG. 1, a case where the through substrate via is columnar is used for schematic illustration. However, the disclosure is not limited thereto. For example, as shown in a through substrate via structure 102 of FIG. 2, it may be applied to continuous through substrate vias with different apertures.

Figure 3:
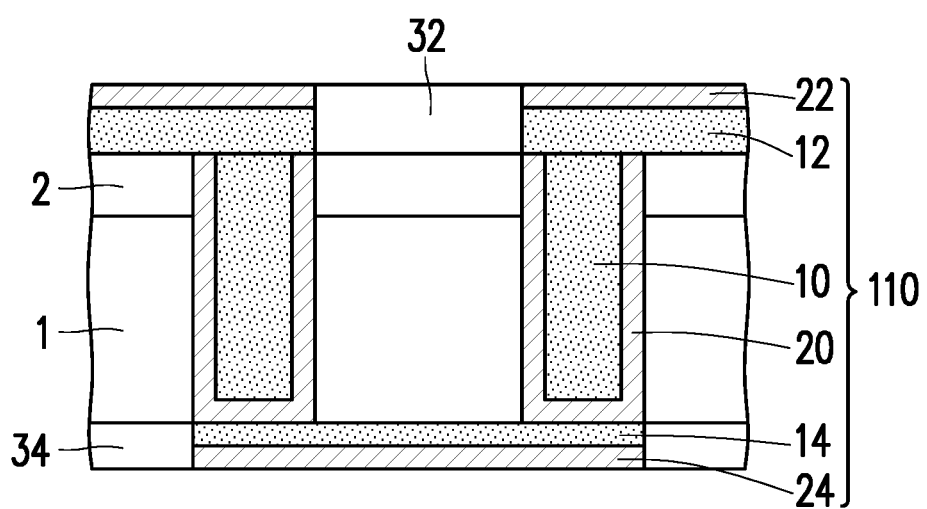
FIG. 3 is a schematic view illustrating a redistribution layer structure according to an embodiment of the disclosure.

FIG. 3 is a schematic view illustrating a redistribution layer structure according to an embodiment of the disclosure. In a redistribution layer structure 110 of FIG. 3, in addition to the original through substrate via structure 100, the redistribution layer structure 110 further includes conductive layers 12 and 14 disposed on at least one surface of the through substrate via structure 100, and nanotwinned metal films 22 and 24 disposed at least on the conductive layers 12 and 14 to form the redistribution layer.

In addition, FIG. 3 shows a case where the conductive layers 12 and 14 and the nanotwinned metal films 22 and 24 are disposed on both surfaces of the through substrate via structure 100. However, the disclosure is not limited thereto, and also includes a case where the conductive layer and the nanotwinned metal film are disposed on one of the surfaces of the through substrate via structure.

A line width of the redistribution layer is 0.1 μm to 1000 μm, and is good about 1 μm to 100 μm. A thickness of the redistribution layer is 0.1 μm to 300 μm, and is good about 1 μm to 10 μm.

In addition, in the embodiment shown in FIG. 3, a case where a layer of dielectric layer (i.e., dielectric layers 32 and 34) are respectively disposed on both surfaces of the substrate 1 is used for schematic illustration. However, the disclosure is not limited thereto. Two or more layers of dielectric layers may be disposed on any surface of the substrate 1, and different redistribution layers may be respectively disposed in each of the dielectric layers.

Hereinafter, a manufacturing method of the through substrate via structure according the disclosure is described. According to the disclosure, the manufacturing method of the through substrate via structure includes the following steps. An insulating layer is disposed on the substrate. The insulating layer is etched. A nanotwinned metal film is disposed at least at an etched portion of the insulating layer. After the nanotwinned metal film is disposed, a conductive layer is disposed at least at the etched portion of the insulating layer.

Figure 4:
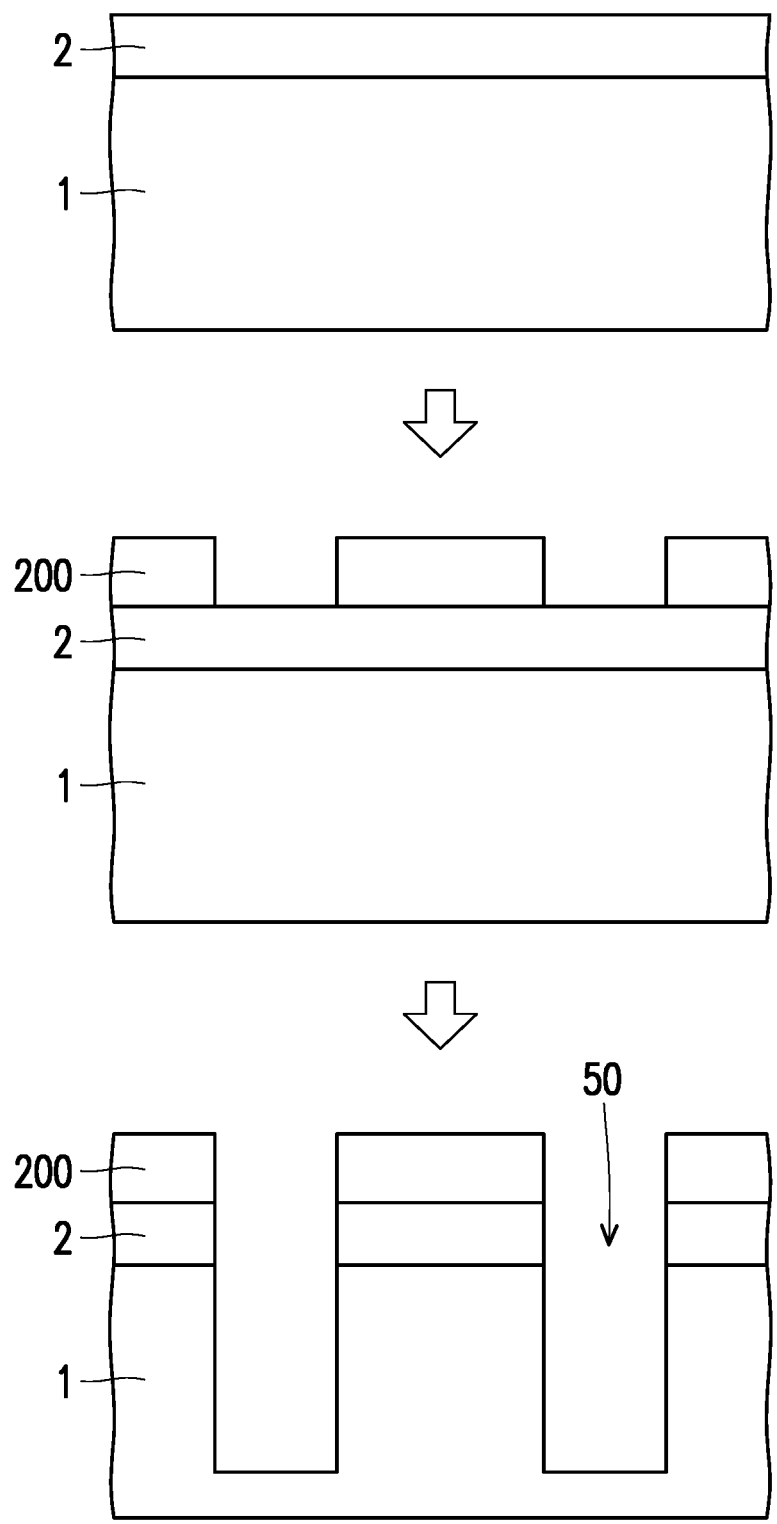
FIG. 4 is a flow chart of manufacturing the through substrate via structure according to the disclosure.
Figure 5:
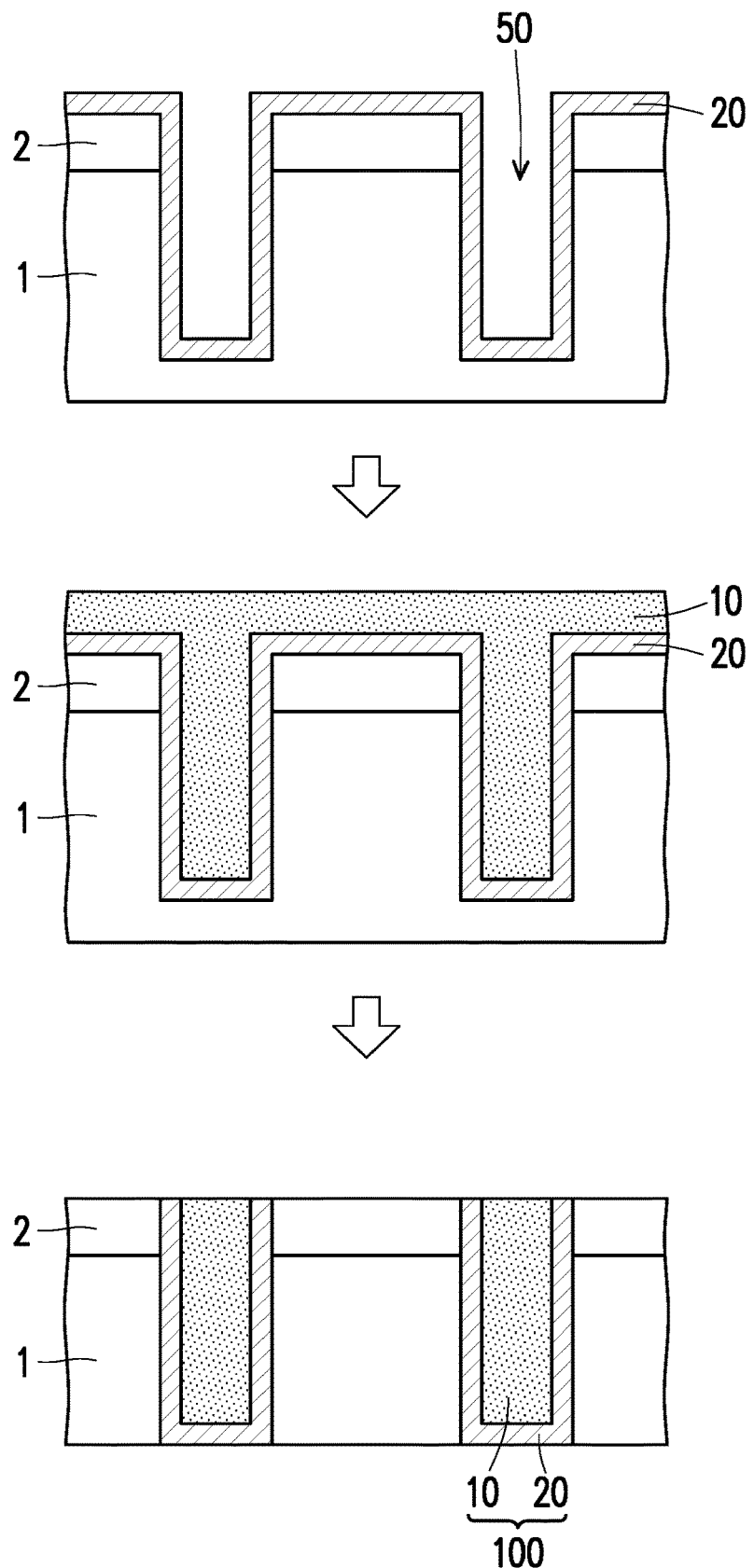
FIG. 5 is a flow chart of manufacturing the through substrate via structure according to the disclosure.
Figure 6:
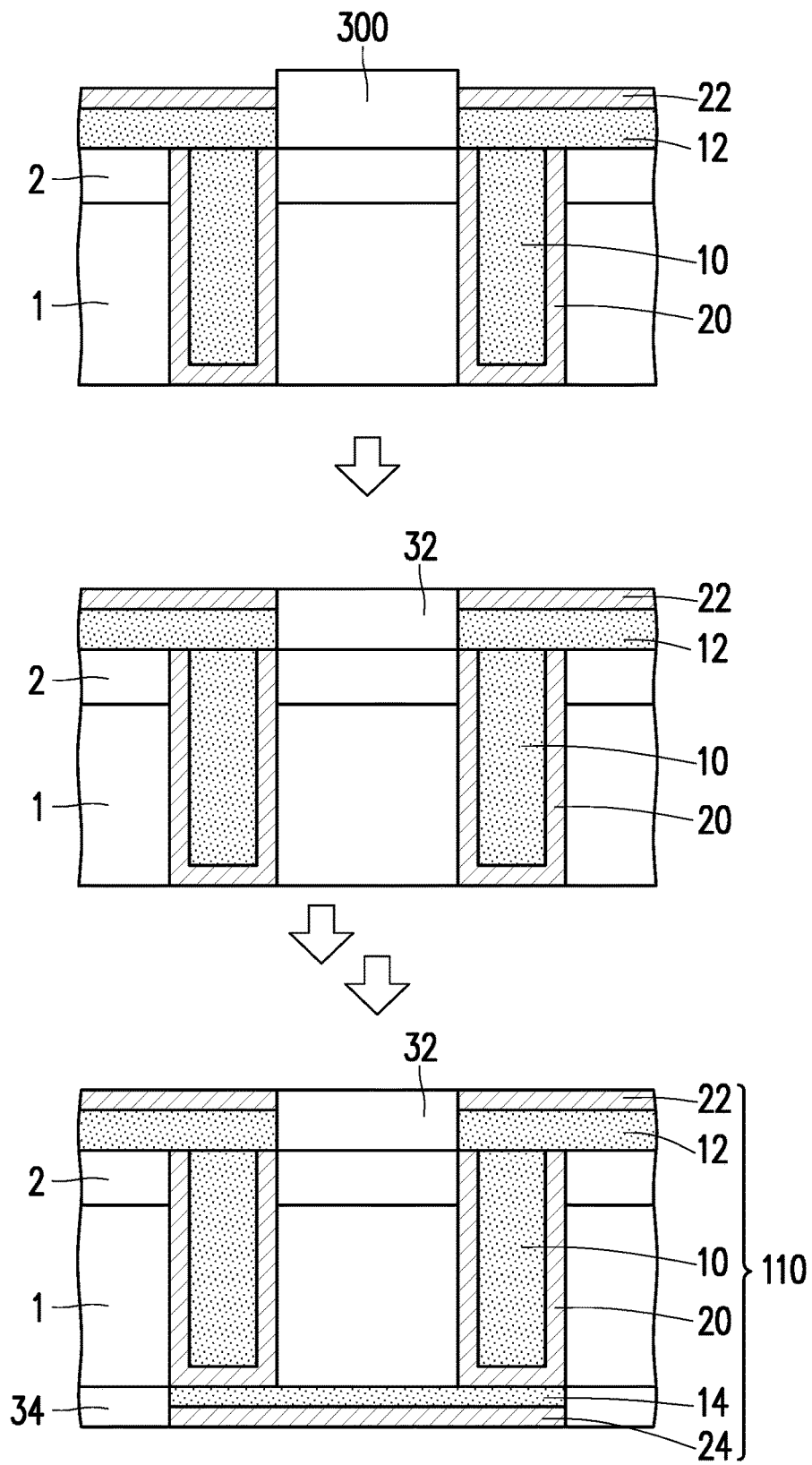
FIG. 6 is a flow chart of manufacturing the redistribution layer structure according to the disclosure.

FIGS. 4 and 5 are flow charts of manufacturing the through substrate via structure according to the disclosure. FIG. 6 is a flow chart of manufacturing the redistribution layer structure according to the disclosure.

First, referring to FIG. 4, the insulating layer 2 is disposed on the substrate 1. Next, after a patterned mask 200 is disposed on the substrate 1, the insulating layer 2 where the mask 200 is not disposed is etched to form a contact window 50.

Then, referring to FIG. 5, after the mask 200 is removed, the nanotwinned metal film 20 is disposed at least at an etched portion (i.e., in the contact window 50) of the insulating layer 2. A method of disposing the nanotwinned metal film 20 may be, for example, an electroplating method or a physical deposition method. The electroplating method may include direct current electroplating, pulse electroplating, and pulse-reverse (PR) electroplating, etc.

Then, after the nanotwinned metal film 20 is disposed, the conductive layer 10 is disposed at least at the etched portion (i.e., in the contact window 50) of the insulating layer 2. A method of disposing the conductive layer 10 may be an appropriate method selected according to the material of the conductive layer 10. For example, when the material of the conductive layer 10 is metal, an electrochemical plating (ECP) method may be used.

Here, in the cross-section of the through substrate via structure 100, relative to the total area of the conductive layer 10 and the nanotwinned metal film 20, the area ratio of the nanotwinned metal film 20 is 50% or less by area, and is good about 20% to 50% by area. If the area ratio of the nanotwinned metal film 20 exceeds 50% by area, the electroplating time of the nanotwinned metal film may rise sharply. Moreover, if the area ratio of the nanotwinned metal film 20 exceeds 50% by area, it is possible that the hollow void structure is generated due to the difference in the electroplating rate between the bottom and the top of the through substrate via, which is not good.

Finally, a wafer thinning process is performed through methods such as grinding or chemical mechanical polishing (CMP), so that at least one end surface of the through substrate via structure 100 is exposed from the substrate 1, and the through substrate via structure 100 according to the first embodiment of the disclosure is completed.

In addition, before the nanotwinned metal film 20 is disposed, a barrier layer (not shown) containing tantalum or titanium may also be disposed in advance at least at the etched portion (i.e., in the contact window 50) of the insulating layer 2.

In addition, before the nanotwinned metal film 20 is disposed, an insulating layer (not shown) may also be disposed in advance at least at the etched portion (i.e., in the contact window 50) of the insulating layer 2.

Referring to FIG. 6, after a patterned mask 300 is disposed on one of the surfaces of the substrate 1, the conductive layer 12 and the nanotwinned metal film 22 are disposed on the substrate 1 where the mask 300 is not disposed.

Next, after the mask 300 is removed, the dielectric layer 32 is disposed on the substrate 1 where the conductive layer 12 and the nanotwinned metal film 22 is not disposed.

Then, the above steps are repeated on the other surface of the substrate 1 to dispose the conductive layer 14, the nanotwinned metal film 24, and the dielectric layer 34. In this way, the redistribution layer structure 110 of the disclosure may be obtained.

Here, methods of disposing the conductive layers 12 and 14, and the nanotwinned metal films 22 and 24 are the same as those of disposing the conductive layer 10 and the nanotwinned metal film 20. Thus, details in this regard will not be further reiterated in the following.

EXAMPLES

Hereinafter, the disclosure will be described in more detail through examples, but the disclosure is not limited by these examples.

Example 1

Figure 7:
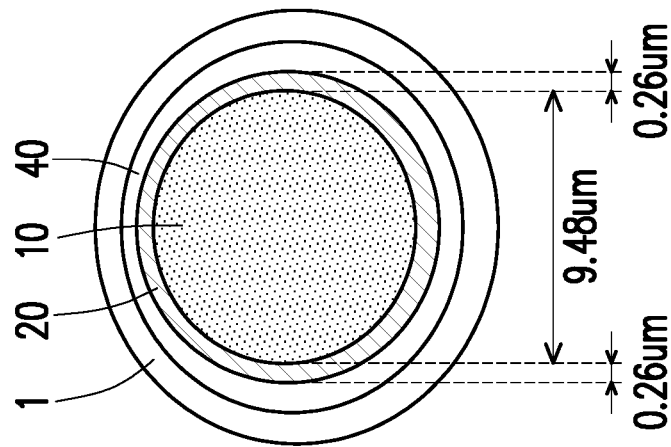
FIG. 7 is a schematic cross-sectional view illustrating the through substrate via structure according to Example 1 of the disclosure.

FIG. 7 is a schematic cross-sectional view illustrating the through substrate via structure according to Example 1 of the disclosure. On a silicon wafer (the substrate 1) with an aperture ratio of 5%, and a through substrate via having an average aperture of 10 μm, an average depth of 100 μm, and an average pitch of 20 μm, a barrier layer 40 is electroplated under the following conditions.

Electroplating solution: a concentrated sulfuric acid solution with a concentration of 100 g/L, including copper ions with a concentration of 50 g/L and chloride ions at 50 ppm, and stirred with a stirrer at 60 rpm Additive: a product DP-100L manufactured by Chemleader corporation or other similar products Electroplating condition: a DC current density of 25 mA/cm$^2$ (2.5 ASD)

The electroplating time is 0.25 minutes, and the average thickness of the nanotwinned metal film is 0.26 μm.

Next, the nanotwinned metal film 20 is electroplated under the following conditions.

Electroplating solution: a concentrated sulfuric acid solution with a concentration of 100 g/L, including copper ions with a concentration of 50 g/L and chloride ions at 50 ppm, and stirred with a stirrer at 60 rpm Additive: a product DP-100L manufactured by Chemleader corporation Electroplating condition: a DC current density of 25 mA/cm$^2$ (2.5 ASD)

The electroplating time is 0.25 minutes, and the average thickness of the nanotwinned metal film is 0.26 μm.

Then, the inner conductive layer 10 is electroplated under the following conditions.

Electroplating solution: a concentrated sulfuric acid solution with a concentration of 100 g/L, including copper ions with a concentration of 50 g/L and chloride ions at 50 ppm, and stirred with a stirrer at 60 rpm Additive: a product DP-100L manufactured by Chemleader corporation Electroplating condition: a DC current density of 25 mA/cm$^2$ (2.5 ASD)

The electroplating time is 0.5 minutes, and the average diameter of the conductive layer 10 is 9.48 μm. In the cross-section of the through substrate via structure 100, relative to the total area of the conductive layer 10 and the nanotwinned metal film 20, the area ratio of the nanotwinned metal film 20 is 10% by area.

Examples 2 to 6 and Comparative Examples 1 to 6

Figure 9:
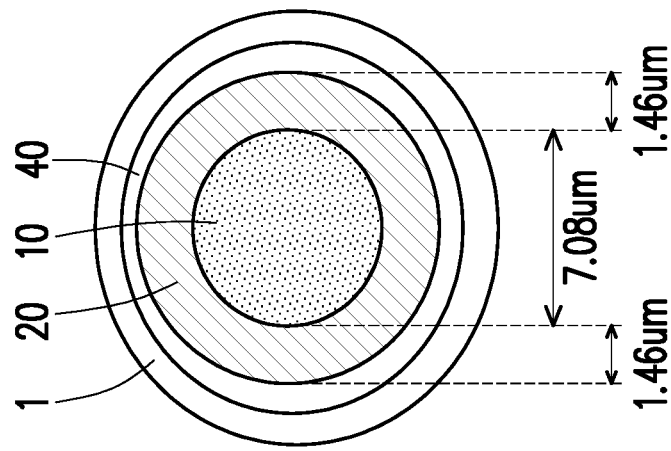
FIG. 9 is a schematic cross-sectional view illustrating the through substrate via structure according to Example 3 of the disclosure.
Figure 8:
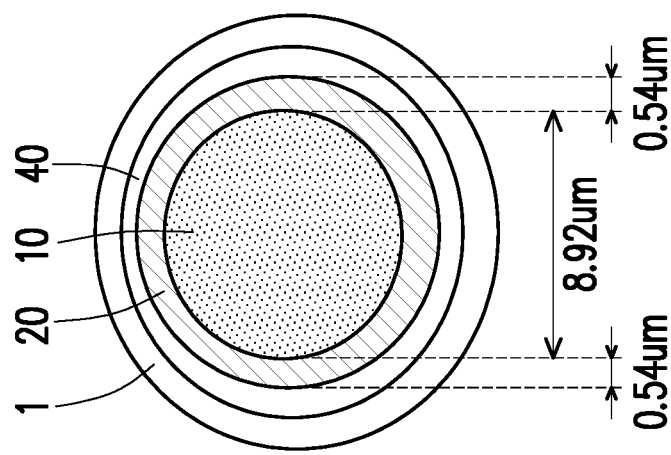
FIG. 8 is a schematic cross-sectional view illustrating the through substrate via structure according to Example 2 of the disclosure.

Examples 2 to 6 and Comparative Examples 1 to 6 are prepared in the same steps as in Example 1, except that the average pitch of the through substrate via and the average thickness of the nanotwinned metal film are changed (as shown in Table 1 and Table 2). FIGS. 8 and 9 are schematic cross-sectional views illustrating the through substrate via structures according to Examples 2 and 3 of the disclosure.

Examples 7 and 8 and Comparative Examples 7 and 8

Examples 7 and 8 and Comparative Examples 7 and 8 are prepared in the same steps as in Example 1, except that the average depth of the through substrate via is changed (as shown in Table 3).

Cumulative Measurement of the Internal Stress of the Equivalent Stress

The respective examples and comparative examples are heated from a room temperature to 200° C. and 400° C., and the equivalent stresses are measured respectively at 200° C. and 400° C.

TABLE 1

|  |  | Example | | | Comparative example | | |
| --- | --- | --- | --- | --- | --- | --- | --- |
|  |  | 1 | 2 | 3 | 1 | 2 | 3 |
| nanotwinned metal film | electroplating time (minutes) | 0.5 | 1 | 1.5 | 0 | 2 | >100 |
|  | average thickness (μm) | 0.26 | 0.54 | 1.46 | 0 | 1.5 | 5 |
| average diameter of the conductive layer (μm) |  | 9.48 | 8.92 | 7.08 | 10 | 7 | 0 |
| area ratio of the nanotwinned metal film |  | 10 | 20 | 50 | 0 | 51 | 100 |

TABLE 1-continued

|  |  | Example | | | Comparative example | | |
| --- | --- | --- | --- | --- | --- | --- | --- |
|  |  | 1 | 2 | 3 | 1 | 2 | 3 |
| through substrate via | average pitch (μm) | 20 | 20 | 20 | 20 | 20 | 20 |
|  | average aperture (μm) | 10 | 10 | 10 | 10 | 10 | 10 |
|  | average depth (μm) | 100 | 100 | 100 | 100 | 100 | 100 |
| depth/aperture ratio |  | 10 | 10 | 10 | 10 | 10 | 10 |
| equivalent stress at 200° C. (MPa) |  | 558.4 | 554.8 | 545.7 | 564.6 | 549.2 | 530.4 |
| equivalent stress at 400° C. (MPa) |  | 1105.9 | 1188.8 | 1169.4 | 1209.7 | 1175.4 | 1136.8 |

TABLE 2

|  |  | Example | | | Comparative example | | |
| --- | --- | --- | --- | --- | --- | --- | --- |
|  |  | 4 | 5 | 6 | 4 | 5 | 6 |
| nanotwinned metal film | electroplating time (minutes) | 0.5 | 1 | 1.5 | 0 | 2 | >100 |
|  | average thickness (μm) | 0.26 | 0.54 | 1.46 | 0 | 1.5 | 5 |
| average diameter of the conductive layer (μm) |  | 9.48 | 8.92 | 7.08 | 10 | 7 | 0 |
| area ratio of the nanotwinned metal film |  | 10 | 20 | 50 | 0 | 51 | 100 |
| through substrate via | average pitch (μm) | 30 | 30 | 30 | 30 | 30 | 30 |
|  | average aperture (μm) | 10 | 10 | 10 | 10 | 10 | 10 |
|  | average depth (μm) | 100 | 100 | 100 | 100 | 100 | 100 |
| depth/aperture ratio |  | 10 | 10 | 10 | 10 | 10 | 10 |
| equivalent stress at 200° C. (MPa) |  | 516.3 | 512.9 | 505.5 | 552.9 | 525.2 | 493.6 |
| equivalent stress at 400° C. (MPa) |  | 1105.9 | 1098.5 | 1082.8 | 1119.9 | 1089.1 | 1057.4 |

TABLE 3

|  | Example | | | Comparative example | | |
| --- | --- | --- | --- | --- | --- | --- |
|  | 2 | 7 | 8 | 1 | 7 | 8 |
| average thickness of the nanotwinned metal film (μm) | 0.54 | 0.54 | 0.54 | 0 | 0 | 0 |
| average diameter of the conductive layer (μm) | 8.92 | 8.92 | 8.92 | 10 | 10 | 10 |
| area ratio of the nanotwinned metal film | 20 | 20 | 20 | 0 | 0 | 0 |
| through substrate via average pitch (μm) | 20 | 20 | 20 | 20 | 20 | 20 |
| average aperture (μm) | 10 | 10 | 10 | 10 | 10 | 10 |
| average depth (μm) | 100 | 50 | 200 | 100 | 50 | 200 |
| depth/aperture ratio | 10 | 5 | 20 | 10 | 5 | 20 |
| total electroplating time (minutes) | 100 | 70 | 140 | 100 | 50 | 200 |

According to Table 1 and Table 2, when the area ratio of the nanotwinned metal film is 50% or less by area (Examples 1 to 6), relative to the case where the nanotwinned metal film is not disposed (Comparative Examples 1 and 4), the equivalent stress of the through substrate via may be effectively reduced. When the area ratio of the nanotwinned metal film 20 exceeds by 50% by area (Comparative Examples 2, 3, 5, and 6), the electroplating time of the nanotwinned metal film may rise sharply.

In addition, when the depth/aperture ratio of the through substrate via structure is set to be 10 to 20 (Examples 1 to 6, and 8), relative to the case where the nanotwinned metal film is not disposed (Comparative Examples 1, 4, and 8), the manufacturing time of the through substrate via structure may be shortened.

Based on the above, the through substrate via structure of the disclosure has a nanotwinned metal film with a specific area ratio. Therefore, not only may the wafer stress effect be effectively reduced, but also the hollow void structure may be avoided. In the meanwhile, the manufacturing time of the through substrate via structure may be shortened. In the through substrate via structure of the disclosure, the area ratio of the nanotwinned metal film is set to be 50% or less by area. In this way, anti-electromigration, elastic modulus, and mechanical strength may be improved.

What is claimed is:
1. A through substrate via structure, comprising:
a columnar conductive layer; and
a nanotwinned metal film disposed at least around the conductive layer, wherein in a cross-section of the through substrate via structure, relative to a total area of the conductive layer and the nanotwinned metal film, an area ratio of the nanotwinned metal film is about 20% to 50% by area.

2. The through substrate via structure according to claim 1, further comprising a barrier layer disposed around the nanotwinned metal film.

3. The through substrate via structure according to claim 1, wherein metal of the nanotwinned metal film is at least one selected from a group consisting of Cu, Ag, Ni, W, Co, and Au.

4. The through substrate via structure according to claim 1, wherein a depth/an aperture ratio of the through substrate via structure is 10 to 20.

5. A redistribution layer structure, comprising:
the through substrate via structure according to claim 1;
a conductive layer disposed on at least one surface of the through substrate via structure; and
a nanotwinned metal film disposed on the conductive layer.

6. A manufacturing method of a through substrate via structure, comprising:
disposing an insulating layer on a substrate;
etching the insulating layer;
disposing a nanotwinned metal film at least at an etched portion of the insulating layer; and
after disposing the nanotwinned metal film, disposing a columnar conductive layer at least at the etched portion of the insulating layer,
wherein in a cross-section of the through substrate via structure, relative to a total area of the conductive layer and the nanotwinned metal film, an area ratio of the nanotwinned metal film is about 20% to 50% by area.

7. The manufacturing method of the through substrate via structure according to claim 6, wherein after etching the insulating layer and before disposing the nanotwinned metal film, the method further comprises:
disposing a barrier layer at least at the etched portion of the insulating layer.

8. The manufacturing method of the through substrate via structure according to claim 6, wherein metal of the nanotwinned metal film is at least one selected from a group consisting of Cu, Ag, Ni, W, Co, and Au.

9. The manufacturing method of the through substrate via structure according to claim 6, wherein a depth/an aperture ratio of the through substrate via structure is 10 to 20.

10. A manufacturing method of a redistribution layer structure, comprising:
the manufacturing method of the through substrate via structure according to claim 6;
disposing a patterned conductive layer on at least one surface of the through substrate via structure; and
disposing a nanotwinned metal film on the conductive layer.

* * * * *